United States Patent [19]

Sameshima

[11] Patent Number: 5,332,482
[45] Date of Patent: Jul. 26, 1994

[54] METHOD AND APPARATUS FOR DEPOSITING AN OXIDE FILM

[75] Inventor: Katsumi Sameshima, Kyoto, Japan

[73] Assignee: Rohm Co., Ltd., Kyoto, Japan

[21] Appl. No.: 37,730

[22] Filed: Mar. 26, 1993

Related U.S. Application Data

[63] Continuation of Ser. No. 826,075, Jan. 27, 1992, abandoned.

[30] Foreign Application Priority Data

May 25, 1991 [JP] Japan .................................. 3-149416

[51] Int. Cl.$^5$ .......................................... C23C 14/34
[52] U.S. Cl. ......................... 204/192.11; 204/192.15; 204/192.22; 204/192.23; 204/298.04
[58] Field of Search ............. 204/192.11, 192.12, 204/192.15, 298.04, 192.18, 192.22, 192.23

[56] References Cited

U.S. PATENT DOCUMENTS

| | | | |
|---|---|---|---|
| 4,007,103 | 2/1977 | Baker et al. | 204/192.3 |
| 4,108,751 | 8/1978 | King | 204/298.04 X |
| 4,142,958 | 3/1979 | Wei et al. | 204/298.04 X |
| 4,885,070 | 12/1989 | Campbell et al. | 204/298.04 X |
| 4,911,809 | 3/1990 | Wort et al. | 204/298.04 X |
| 4,965,248 | 10/1990 | Poppe et al. | 204/298.07 X |

*Primary Examiner*—Nam Nguyen
*Attorney, Agent, or Firm*—Brumbaugh, Graves, Donohue & Raymond

[57] ABSTRACT

The specification discloses a method and apparatus for depositing an oxide film by ion-beam sputtering in which an oxide film is formed on the surface of a wafer by sputtering particles from a target toward the wafer and supplying ozone adjacent to the wafer to oxidize the particles that are close to the surface of the wafer.

5 Claims, 1 Drawing Sheet

METHOD AND APPARATUS FOR DEPOSITING AN OXIDE FILM

This application is a continuation of application Ser. No. 07/826,075, filed on Jan. 27, 1992, abandoned.

BACKGROUND OF THE INVENTION

This invention relates to a method and apparatus for depositing an oxide film on the surface of a wafer.

Conventionally, an oxygen ion or gas atmosphere has been used when depositing an oxide film on a wafer by reactive ion-beam sputtering. However, if oxygen gas is used, the merging of sputtered particles is insufficient to achieve the desired film formation. On the other hand, the presence of oxygen ions can potentially cause damage to the deposited film. In addition, the films produced by these conventional techniques have an undesirably low crystallinity since the film is formed with sputtered particles which react with an oxygen ion in flight to form an oxide which builds up between the wafer and the deposited material. Further, the use of an oxygen atmosphere causes the reaction to be carried out at high temperatures resulting in various problems.

SUMMARY OF THE INVENTION

Accordingly, it is an object of the present invention to provide a method and apparatus for depositing an oxide film which overcomes the disadvantages of the prior art.

Another object of the invention is to provide a method and apparatus adapted to deposit oxide films of high quality at low temperature.

These and other objects of the invention are attained by depositing an oxide film by ion-beam sputtering of particles from a target toward the surface of a wafer and applying ozone to the particles that have been sputtered from the target in a region close to the surface of the wafer.

A film-depositing apparatus according to the invention includes a target, an ion beam source that emits an ion beam toward the target, a support for a wafer disposed in a position to receive particles sputtered from the target, and an ozone supply for providing ozone in a region near the surface of a wafer supported in the wafer support.

In accordance with the present invention, ozone provided in a region near the surface of the wafer is sufficiently active by itself to react with sputtered particles at a low temperature. In addition, the reaction of the ozone is promoted when the ozone receives heat from the wafer in the region adjacent to the wafer. Consequently, the mechanism of epitaxial growth can be used with the invention to form highly crystalline films.

BRIEF DESCRIPTION OF THE DRAWINGS

Further objects and advantages of the invention will be apparent from a reading of the following description in conjunction with the accompanying drawings, in which.

DESCRIPTION OF PREFERRED EMBODIMENT

Figure 1:
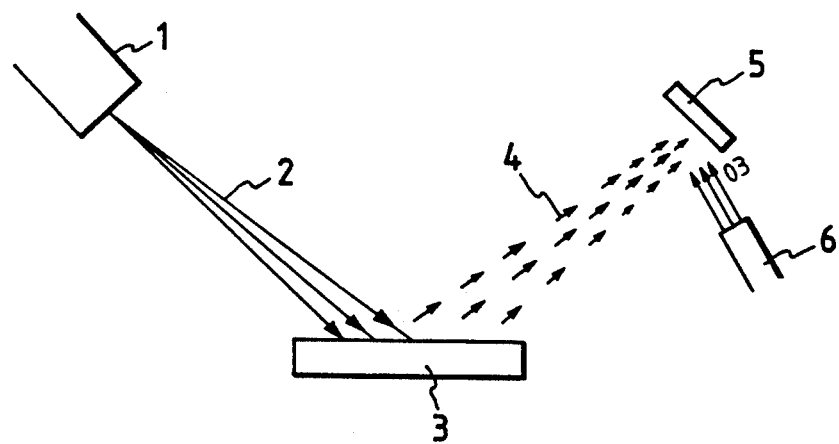
FIG. 1 is a schematic diagram showing a representative method for depositing an oxide film according to a preferred embodiment of the present invention.

In the representative method for depositing an oxide film in accordance with the present invention as shown in FIG. 1, an ion beam source 1 emits an ion beam 2 toward a target 3. Typical target materials are Si, $SiO_2$ and PZT (lead titanate zirconate). When the emitted ion beam 2 impacts the target 3, sputtered particles of the target material 4 are ejected in a given direction.

A wafer 5 is mounted in a position to receive the sputtered particles 4. The wafer 5 is typically heated from the back with a back-heating apparatus (not shown). In accordance with the invention, an ozone supply device 6 supplies ozone ($O_3$) so that it flows onto the surface of the wafer 5. An ozonizer is typically used as the ozone supply device.

In the film-depositing apparatus according to the illustrated embodiment, the surface of the wafer 5 is blanketed with an ozone layer. Since the ozone becomes active in response to the relatively low heat which it receives from the wafer 5, it will react readily with the sputtered particles 4 as they approach the wafer 5 so as to be deposited as an oxide on the wafer surface.

If PZT is used as the target 3, Pb is present in the sputtered particles 4. Since Pb has a low vapor pressure, it tends to vaporize from the wafer 5 once it has been deposited. To compensate for this, 10–20% more PbO is conventionally added to the target. However, if active ozone is present in the atmosphere near the wafer surface, as in the illustrated embodiment, the Pb in flight will readily react with ozone to form PbO so that the vaporization of Pb from the surface can be prevented. An obvious advantage of this phenomenon is that an oxide of a desired compositional ratio (Pb ratio) can be formed on the wafer even if the target is PZT and therefore there is no need to add an excess amount of PbO or other supplementary compounds to the target as in the prior art.

Figure 2A:
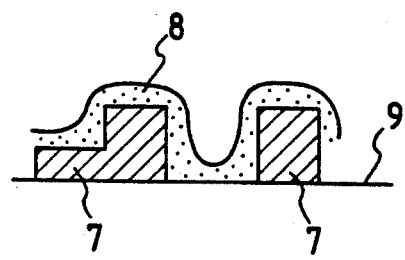
FIGS. 2(a) and 2(b) are schematic illustrations showing oxide films deposited on wafers in accordance with the invention.
Figure 2B:
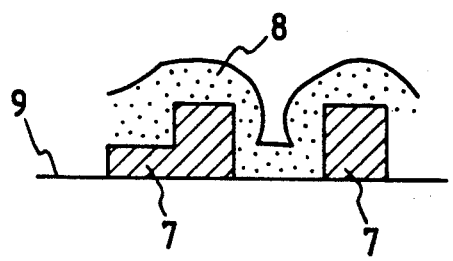

It is not essential that the ozone be heated by heat from the wafer 5. However, in the illustrated embodiment, where ozone is heated from the wafer 5 so as to react with sputtered particles 4, epitaxial growth will take place in response to the heat received from the back of the wafer so that an oxide film of very high crystallinity can be obtained. This will provide a benefit in the case where a semiconductor device of the type shown in FIG. 2(a), having a surface 9 which is uneven because of the presence of wiring 7, must be provided with a protective film 8. By using the present invention, an oxide film 8 can be formed which has good coverage and uniform thickness to fill any recesses and cover any ridges as shown in FIG. 2(a). In contrast, FIG. 2(b) shows a protective film 8 that has been formed without using the method of the invention. Consequently, the deposited film has poor coverage and nonuniform thickness.

As described above, the present invention utilizes a very simple construction and yet it is capable of forming an oxide film of high crystallinity and good coverage at low temperature. As a further advantage, a film of desired compositional ratio can be obtained with a multi-element target such as PZT since the constituent particles for the film will rapidly undergo an oxidation reaction. Therefore, the present invention will find great industrial utility.

Although the invention has been described herein with reference to a specific embodiment, many modifications and variations therein will readily occur to those skilled in the art. Accordingly, all such variations and modifications are included within the intended scope of the invention.

We claim:

1. A method for depositing an oxide film by ion-beam sputtering comprising sputtering particles from a target toward a surface on which an oxide film is to be formed and supplying ozone adjacent to the surface from an ozonizer to produce a blanket of ozone without oxygen ions adjacent to the surface to oxidize particles that have been sputtered from the target at a location close to the surface before the particles are deposited on the surface while avoiding damage to the deposited film resulting from the presence of ionized oxygen.

2. A film-depositing apparatus comprising a target, an ion beam source for emitting an ion beam toward the target, means for supporting a member having a surface in a position for the surface to receive the particles sputtered from the target, and ozone supply means for supplying ozone to a region adjacent to the surface from an ozonizer to produce a blanket of ozone without oxygen ions adjacent to the surface to oxidize particles that have been sputtered from the target before they are deposited on the surface while avoiding damage to the deposited film resulting from the presence of ionized oxygen.

3. A method for depositing an oxide film by ion-beam sputtering comprising sputtering particles from a target toward an irregular surface on which an oxide film is to be formed and supplying ozone adjacent to the surface from an ozonizer to produce a blanket of ozone without oxygen ions adjacent to the surface to oxidize particles that have been sputtered from the target at a location close to the surface to form a substantially uniform layer on the irregular surface while avoiding damage to the deposited film resulting from the presence of ionized oxygen.

4. A method for depositing an oxide film by ion-beam sputtering comprising sputtering particles from a lead titanate zirconate target toward a surface on which an oxide film is to be formed and supplying ozone adjacent to the surface from an ozonizer to produce a blanket of ozone without oxygen ions adjacent to the surface to oxidize particles that have been sputtered from the target at a location close to the surface while avoiding damage to the deposited film resulting from the presence of ionized oxygen.

5. A method for depositing an oxide film by ion-beam sputtering comprising sputtering particles from a target toward a surface on which an oxide film is to be formed, supplying ozone adjacent to the surface from an ozonizer to produce a blanket of ozone without oxygen ions adjacent to the surface to oxidize particles that have been sputtered from the target at a location close to the surface and heating the surface to provide high crystallinity in the oxide film while avoiding damage to the deposited film resulting from the presence of ionized oxygen.

* * * * *